United States Patent [19]

Patrick et al.

[11] Patent Number: 5,407,524

[45] Date of Patent: Apr. 18, 1995

[54] END-POINT DETECTION IN PLASMA ETCHING BY MONITORING RADIO FREQUENCY MATCHING NETWORK

[75] Inventors: Roger Patrick, Santa Clara, Calif.; Frank Bose, Wettingen, Switzerland

[73] Assignee: LSI Logic Corporation, Milpitas, Calif.

[21] Appl. No.: 106,017

[22] Filed: Aug. 13, 1993

[51] Int. Cl.[6] .............................................. H05H 1/00
[52] U.S. Cl. ................................... 156/627; 156/626; 156/345; 204/298.32; 204/192.33
[58] Field of Search ....................... 156/627, 626, 345; 204/192.13, 192.33, 298.03, 298.32

[56] References Cited

U.S. PATENT DOCUMENTS

| | | | |
|---|---|---|---|
| 4,207,137 | 1/1980 | Tretola | 156/627 |
| 4,679,007 | 7/1987 | Reese et al. | 333/17.3 |
| 4,954,212 | 9/1990 | Gabriel et al. | 156/627 |
| 5,195,045 | 3/1993 | Keane et al. | 333/17.3 |

*Primary Examiner*—Thi Dang
*Attorney, Agent, or Firm*—Honigman Miller Schwartz and Cohn

[57] ABSTRACT

The present invention relates to a system and method for detecting the end-point of a layer being removed from a semiconductor wafer by a plasma etching system. The invention determines end-point by referencing first and second positions of matching components of a matching network between a radio frequency source and the plasma etching system chamber. Comparison of a first position representative of chamber load impedance before end-point, and a second position representative of a change in chamber load impedance is utilized to determine end point.

13 Claims, 2 Drawing Sheets

END-POINT DETECTION IN PLASMA ETCHING BY MONITORING RADIO FREQUENCY MATCHING NETWORK

BACKGROUND OF THE INVENTION

FIELD OF THE INVENTION

The present invention relates to plasma etching systems and, more particularly, to a method and apparatus for detecting film etching end-point.

DESCRIPTION OF THE RELATED TECHNOLOGY

Ionized gas or "plasma" may be used during processing and fabrication of semiconductor devices. Plasma is used to etch or remove material from semiconductor integrated circuit wafers. To use plasma in the integrated circuit fabrication process, typically, a low pressure process gas is introduced into a process vessel chamber surrounding an integrated circuit wafer. The process vessel is used to maintain the low pressures required for the plasma and to serve as a structure for attachment of the energy source. The process gas is ionized into a plasma by the energy source after entering the chamber, and the plasma flows over the semiconductor integrated circuit wafer.

Plasma may be created from a low pressure process gas by inducing an electron flow which ionizes individual gas molecules from the transfer of kinetic energy through individual electron-gas molecule collisions. Typically, electrons are accelerated in an electric field such as one produced by radio frequency ("RF") energy. Low frequencies (below 550 KHz), high frequencies (13.56 MHz), or microwaves (2.45 GHz).

Plasma etching of semiconductor wafers may be performed by plasma etching mode or reactive ion etching (RIE). A plasma etching system consists of a radio frequency energy source and a pair of electrodes. A plasma is generated between the electrodes while the semiconductor wafer is planar with one of the electrodes. The chemical species in the plasma are determined by the source gas(es) used.

Plasma etching methods and apparatus are generally illustrated in U.S. Pat. Nos. RE 30,505 and 4,383,885. These patents illustrate plasma etching systems. A method and apparatus for obtaining a substantially parallel (planar) plasma for processing of integrated circuit wafers is described in U.S. Pat. No. 4,948,458. The invention disclosed in this patent consists of an enclosure having an interior bounded at least in part by a radio frequency transparent window. A planar coil is disposed proximate to the window, and a radio frequency energy source is coupled through an impedance matching circuit to the coil. The planar coil radiates the radio frequency energy such that a planar magnetic field is induced in the interior of the enclosure. A plasma is generated thereby in the process gas. This plasma reacts with the surface of the semiconductor wafer thereby etching it away.

The time to completion of any etching process can be calculated by determining the average etch rate of the process and calculating the time necessary to etch through the layer. Etching is then allowed to continue for an over etch period necessary to compensate any etch rate nonuniformity, layer thickness non-uniformity, or underlying topography. It is always desirable to minimize the over etch time so that the erosion of the underlying layer is minimized. A method for determining the nominal end-point of the process allows such a reduction in over etch time.

In plasma etching, it is critical to utilize end-point detection to determine when the desired film is removed and to terminate the etching process, thus minimizing damage to the exposed underlying film. Semiconductor wafers and flat panel displays are particularly sensitive to over etching and damage to the underlying layer.

End-point detection has been accomplished by measuring the film thickness optically by interferometer, ellipsometer, or light beam displacement. If the film is opaque, the difference in reflectivity between the film being etched and the one beneath it can be used to detect endpoint. The presence of a reaction product or the absence of a reacting species can be monitored and used to determine when the film etching is complete.

A commonly used method for end-point detection is based upon monitoring the optical emission from the plasma and detecting changes therein when one film is cleared during the etching process and the underlying film is exposed. U.S. Pat. No. 4,312,732, issued to Degenkob et al. illustrates this method. Optical emission monitoring, however, has two major drawbacks.

First, there must be a change in optical emission at an endpoint, i.e., some emitting species in the plasma must change concentration when the film being etched is cleared. This change in concentration can either be increasing or decreasing, however, a suitable species to monitor must be available from the etching process. Second, the concentration changes must be sufficient to be readily detectable by the monitoring system. When processing semiconductor wafers with relatively small exposed pattern areas, for example, less than two percent, the monitoring system is not sensitive enough to detect the very small species changes.

Another method utilized for end-point detection is detecting a change in process pressure. Monitoring process pressure, however, is usually not a very sensitive method of detecting end-point. Typically, modern etching systems actively control process pressure, thus masking any pressure changes at end-point.

Still another method for end-point detection is measuring the radio frequency impedance of the etching system during the etching process. Monitoring of the impedance requires sensors to measure the RF current, voltage and phase angle from which the plasma impedance may be calculated. These sensors add significantly to the hardware costs and may be prone to errors if there are substantial RF harmonics in the plasma load.

The electrode impedance may be monitored by phase and resistance detectors. The phase detector determines whether the radio frequency voltage and current monitored are in phase or out of phase. Depending on the phase relationship between the voltage and current, the impedance is either a pure resistance or has reactive components, i.e., capacitance or inductance. The resistance detector determines the actual resistance of the load. Harmonics in the detected RF may produce false readings from these detectors.

What is needed is a simple, reliable, and cost effective way of determining when an end-point is reached. It is therefore an object of the present invention to determine an end-point without having to rely upon expensive and hard to use optical instruments, or special RF impedance detectors.

SUMMARY OF THE INVENTION

The present invention provides a system and method for determining end-point in a plasma etching process that is simple, cost effective and reliable. The present invention accomplishes this object by monitoring the positions of the variable matching components of the matching network used between the RF power source and the plasma electrode load. The matching network typically consists of variable capacitors and/or inductors as the variable matching components at low or high frequencies, and variable cavity taps or matching stubs at microwave frequencies. One or more position sensors are coupled to one or more of the variable matching components so as to indicate their positions. From a change in position of any of the matching components, a determination of end-point may be obtained.

For a given etching process condition, the matching network is adjusted so that the RF source "sees" a resistive load at its source impedance. When the etching process parameters change, as when an end-point is reached, the load impedance changes. RF plasma etching systems utilize matching networks that automatically adjust to changes in the load impedance, thus maintaining a constant impedance for the RF source. A properly adjusted matching network will match the resistance of the RF source to the load resistance (etching system) and cancel out any reactive (capacitive or inductive) components of the load.

RF source to load matching is accomplished by adjusting the matching components of the matching network. The present invention utilizes the positional changes of these matching components to determine when there is a change in the load impedance representative of an etching process end-point. By so doing, an advantage of the present invention is that it does not depend upon the chemical identity and spectroscopic properties of the etched materials and process gases.

Another advantage is in utilizing a positional sensor such as a resistive potentiometer which has inherently low noise and allows for high signal amplification to magnify small positional changes.

Yet another advantage is faster response time than from optical emission detectors because the present invention position sensors do not rely upon transport and analysis of material from the process gas discharge.

A further advantage is that the position sensors are more sensitive to thematching network compensating for small impedance changes such as when small exposed wafer areas are etched.

Other and further objects, features and advantages will be apparent from the following description of presently preferred embodiments of the invention, given for the purpose of disclosure and taken in conjunction with the accompanying drawings.

DESCRIPTION OF A PREFERRED EMBODIMENT

Figure 1:
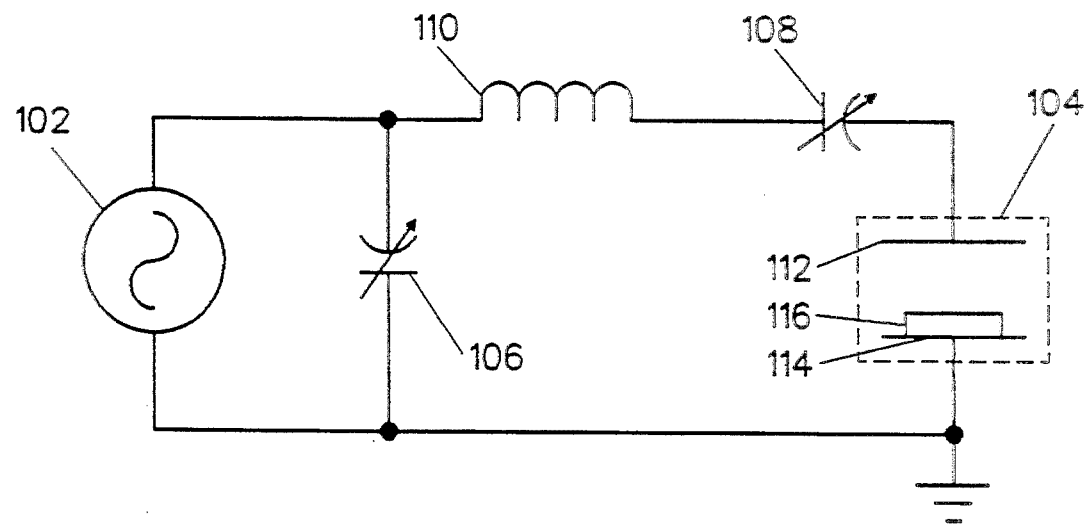
FIG. 1 is a schematic block diagram of an RF plasma etching system.

Referring now to the drawings, the details of a preferred embodiment are schematically illustrated. Like elements are numbered the same, and similar elements are represented by the same number and a different lower case letter suffix.

Referring now to FIG. 1, a system for plasma etching a semiconductor wafer is illustrated schematically. An RF source 102 is coupled to a plasma etching chamber 104 through a matching network consisting of variable capacitors 106 and 108, and variable coil 110. The chamber 104 includes electrodes 112 and 114. A semiconductor wafer 116 is in planar communication with the electrode 114. An RF excitation field is created between the electrodes 112 and 114, and when a process gas or gases (not illustrated) is introduced into the chamber 104, the gas turns into a plasma. The plasma reactively etches the surface of the semiconductor wafer 116.

Maximum transfer of RF power from the RF source 102 to the chamber 104 electrodes 112 and 114 results when the chamber 104 load impedance is matched to the impedance of the RF source 102. The values of variable coil 110, and variable capacitors 106 and 108 are selected for an appropriate impedance transformation between the RF source 102 and the chamber 104 electrodes 112 and 114. Variable capacitors 106 and 108 are adjusted to obtain a substantially resistive termination for the RF source 102.

Present day RF plasma etching systems utilize automatic impedance matching systems that detect changes in the load impedance of the electrodes 112 and 114. The automatic matching system (not illustrated) adjusts the variable capacitors 106 and 108 to maintain a constant resistive load for the RF source 102. The load impedance changes when a layer is etched substantially off the semiconductor wafer 116. Thus, the automatic impedance matching system may adjust either or both variable capacitors 106 and 108 when the layer is etched off the semiconductor wafer 116.

Figure 2:
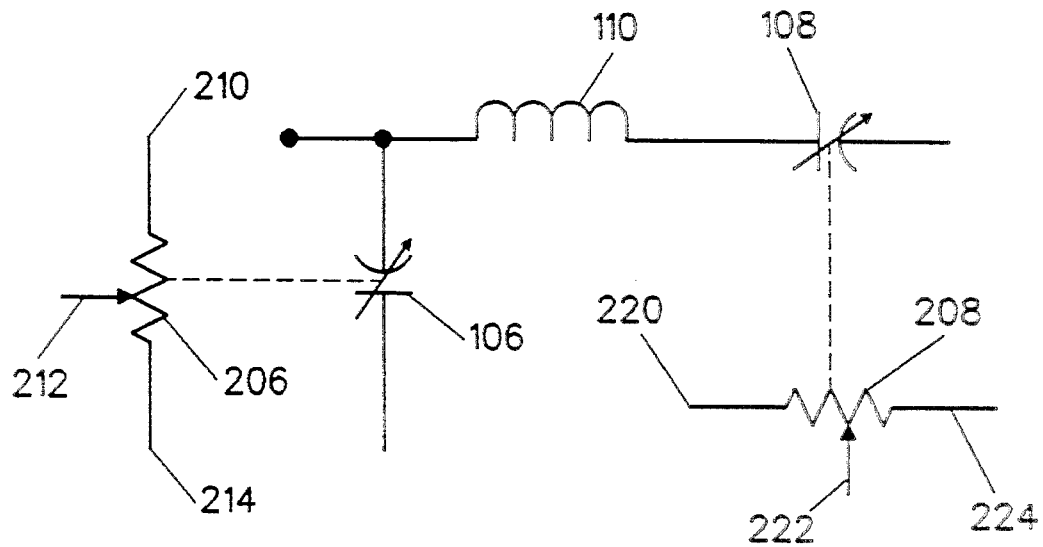
FIG. 2 is a schematic block diagram of a preferred embodiment of the present invention.

Referring now to FIG. 2, a schematic block diagram of a preferred embodiment of the present invention is illustrated. Variable resistors 206 and 208 are mechanically coupled to the variable capacitors 106 and 108, respectively. The variable resistors 206 and 208 may be potentiometers which rotatably vary in resistance by means of a shaft (not illustrated). The potentiometer shaft is coupled to the rotatable shaft of the respective capacitor, either directly or through gears, belts, or pulleys (not illustrated).

The variable resistors 206 and 208 are three contact terminal potentiometers having first, second and third contacts 210, 212 and 214; and 220, 222 and 224; respectively. The second contact or "wiper" is rotatably attached to the potentiometer shaft, and is in electrical communication with resistive material between the first and third contacts 210 and 214, respectively. The wiper moves over the resistive material when the respective capacitor shaft rotates, thus varying the resistance between the wiper second contact 212 and the first contact 210. Likewise, the resistance between the wiper second contact 212 and third contact 214 varies, but in the opposite direction, i.e., when the resistance between contacts 210 and 212 decreases, the resistance between contacts 212 and 214 increases.

Figure 3:
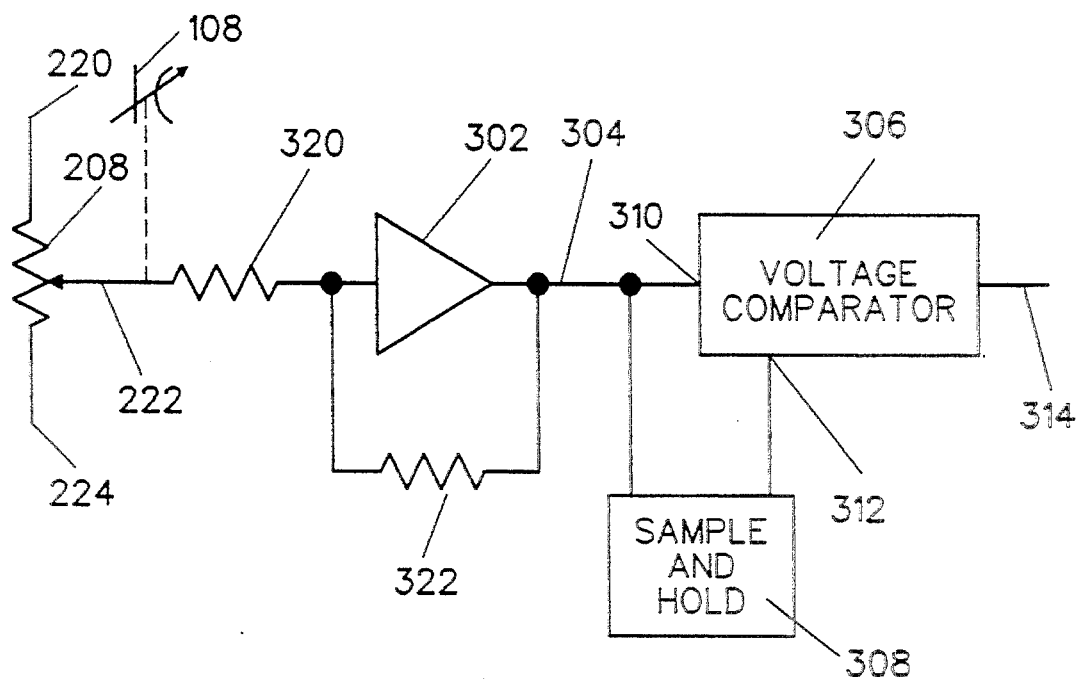
FIG. 3 is a schematic block diagram of an aspect of the present invention.

Referring to FIG. 3, a schematic block diagram of an aspect of the present invention is illustrated. For simplification of this disclosure, only operation of variable capacitor 108 will be described herein. Operation of the variable capacitor 106 is equally applicable, as is operation of the variable coil 110. The variable capacitor 108, rotatably coupled to the wiper shaft of the variable resistor 208, causes contact 222 to change position with respect to contacts 220 and 224.

Thus, the resistance values between contacts 220 and 222, and 222 and 224 vary respective to the rotational position of the variable capacitor 108. Thus, as the variable capacitor 108 is adjusted during matching of the chamber 104 load to the RF source 102, the variable resistor 208 continuously indicates the variable capacitor 108 rotational position.

A voltage reference (not illustrated) may be connected between the contacts 220 and 224 so that when the wiper of contact 222 varies position, the voltage on contact 222 also varies. The voltage on contact 222 will be proportional to the position of the wiper of contact 222 and thus the position of the variable capacitor 108. The contact 222 voltage is applied to the input of a direct current amplifier 302 where it is amplified to a desired sensitivity value determined by gain adjustment resistors 320 and 322. The output of the amplifier 302 is representative of the position of variable capacitor 108.

This amplified positional voltage signal is represented generally by the number 304. Voltage signal 304 is applied to a voltage comparator 306 and a sample and hold 308. The voltage comparator has reference inputs 310 and 312 and comparison output 314. The sample and hold 308 has an input connected to the voltage signal 304 and an output connected to the input 312 of the voltage comparator 306. The sample and hold 308 is used to store a first voltage representative of a first determined position of the variable capacitor 108. The sample and hold 308 maintains this first voltage on input 312 of the voltage comparator 306.

The voltage signal 304 also is connected to input 310 and is representative of the present position of the variable capacitor 108. The comparator is used to determine when an expected change in the position of the variable capacitor 108 occurs. The comparator generates a signal on output 314 when the voltages on inputs 310 and 312 are sufficiently different. The output signal of the voltage comparator 306 is used to represent detection of an end-point.

Figure 4:
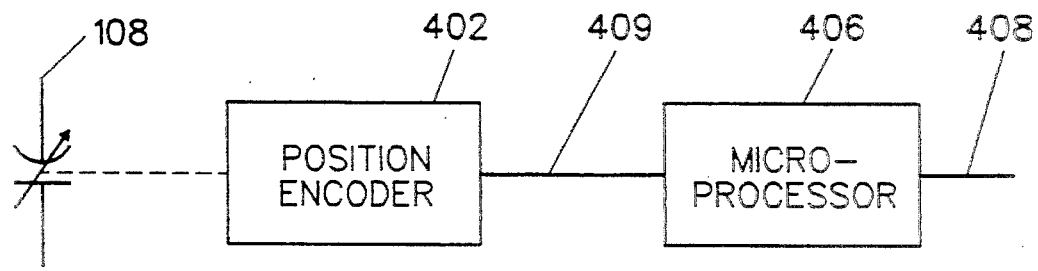
FIG. 4 is a schematic block diagram of another aspect of the present invention.

Referring now to FIG. 4, a schematic block diagram of another aspect of the present invention is illustrated. A position encoder 402 is mechanically coupled to the variable capacitor 108 and utilized to indicate the rotational position thereof. The position encoder 402 may be, for example, an optical encoder having a positional encoding wheel that either blocks or allows light to pass between light emitting diodes (LED) and light detectors, depending on rotational position. Digital position encoding is well known to those skilled in the art of servo systems and robotics.

A digitally encoded output signal 404 from the position encoder 402 is connected to a microprocessor 406 which is programmed to record a first capacitor position and to monitor a present capacitor position. When the first and present capacitor positions are sufficiently different by a predetermined amount, the microprocessor 406 outputs a signal 408 that represents detection of end-point.

Figure 5:
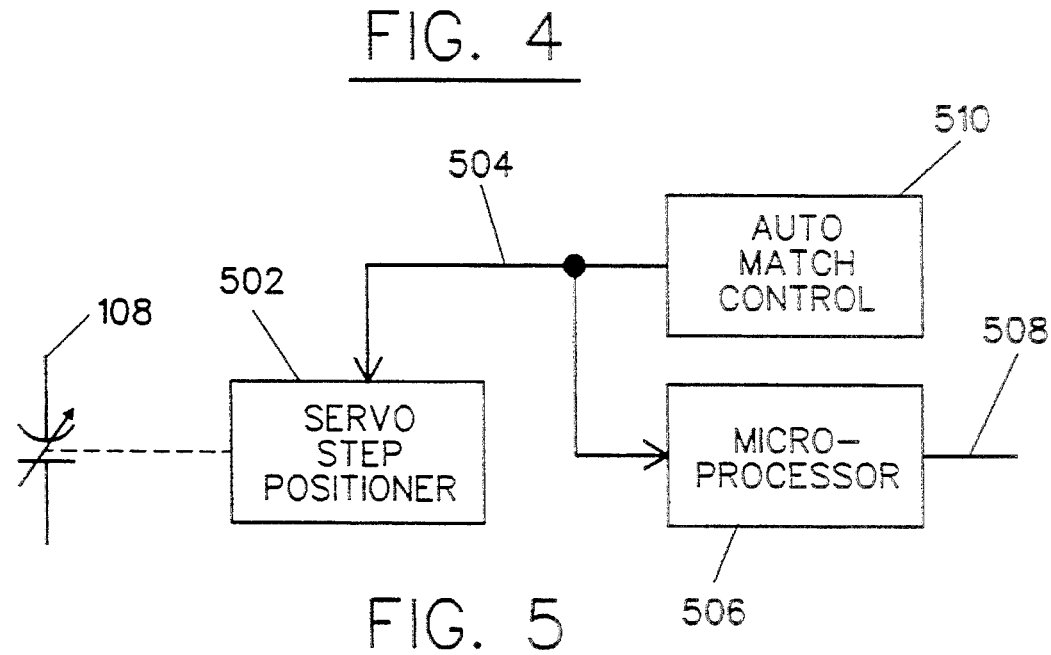
FIG. 5 is a schematic block diagram of yet another aspect of the present invention.

Referring to FIG. 5, a schematic block diagram of yet another aspect of the present invention is illustrated. A servo step positioner 502 is mechanically coupled to the variable capacitor 108. The servo step positioner 502 is used to rotate the shaft of the variable capacitor 108 when receiving rotation command pulse signals from the automatic matching control system 510. The servo step positioner is capable of clockwise ("CW") and counter clockwise ("CCW") rotation under the direction of the automatic matching control system 510. A microprocessor 506 is programmed to record a first capacitor position and then to count the number of CW and CCW pulses on signal line 504 representative of rotational position commands from the matching control system 510. In this way, the microprocessor can determine the amount of rotational change made by the variable capacitor 108 and upon a predetermined rotational change, an output 508 indicates detection of end-point.

Many other combinations of means for positional monitoring of the component parts of the matching network perform equally well in determining detection of end-point. Some of the matching network components are directed to changing the resistive component of the load to equal the source resistance. Other components are directed to compensating for inductive or capacitive reactance of the load. Each component parameter has value in determining detection of end-point and the positional change of the components taken either singularly or in combination may be utilized.

The present invention, therefore, is well adapted to carry out the objects and attain the ends and advantages mentioned, as well as others inherent therein. While a presently preferred embodiment of the invention and various aspects thereto has been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. A method for detecting end-point during plasma etching, comprising the steps of:

monitoring the position of at least one adjustable matching element of a radio frequency matching network that is connected between a radio frequency power source and a radio frequency load of a plasma etching system;

determining a first position of the at least one adjustable matching element; and comparing the first position with a present position of the at least one adjustable matching element, wherein a predetermined amount of change in position of the at least one adjustable matchUg element indicates etching end-point.

2. An apparatus, in a plasma etching system, for detecting end-point, comprising:

a radio frequency matching network, said matching network connected between a radio frequency power source and a radio frequency load of the plasma etching system;

said matching network having at least one adjustable matching element for matching the load to the source;

said at least one adjustable matching element having a corresponding position sensor, wherein said corresponding position sensor indicates the position of said at least one adjustable matching element; and means for monitoring said corresponding position sensor, whereby a change in position of said at least one adjustable matching element is detected.

3. The apparatus of claim 2, wherein said at least one adjustable matching element is a variable capacitor.

4. The apparatus of claim 2, wherein said at least one adjustable matching element is a variable inductor.

5. The apparatus of claim 2, wherein said at least one adjustable matching element is a microwave tap.

6. The apparatus of claim 2, wherein said at least one adjustable matching element is a microwave matching stub.

7. The apparatus of claim 2, wherein said corresponding position sensor is a variable resistance potentiometer.

8. The apparatus of claim 2, wherein said corresponding position sensor is a digital encoder.

9. The apparatus of claim 8, wherein said digital encoder is an optical encoder comprising a plurality of light sources, a plurality of light detectors aligned with and detecting said plurality of light sources, and an encoding wheel between said plurality of light sources and detectors, said encoding wheel rotationally attached to said at least one adjustable matching element so that when said matching element rotates said encoding wheel either blocks or allows light to pass between said plurality of light sources and detectors depending on the rotatio.nal position of said at least one adjustable matching element.

10. The apparatus of claim 2, wherein said monitoring means comprises:
 a sample and hold circuit having an input and output, the input connected to said corresponding position sensor;
 a comparator having first and second inputs and an output, said comparator first input connected to said corresponding position sensor and said comparator second input connected to said sample and hold output;
 said sample and hold storing a first position value representative of a first position of said at least one adjustable matching element and outputting this value on its output; and
 said comparator outputting an end-point detection signal on its output when there is a predefined difference between the first position value stored in said sample and hold circuit and a second position value representative of the present position of said at least one adjustable matching element.

11. The apparatus of claim 2, wherein said monitoring means is a microprocessor, said microprocessor storing a first position value representative of a first position of said at leastone adjustable matching element and comparing the first position value with a second position value representative of the present position of said at least one adjustable matching element, and outputting an end-point detection signal when there is a predefined difference between the first and second position values.

12. An apparatus, in a plasma etching system, for detecting end-point, comprising:
 a radio frequency matching network, said matching network connected between a radio frequency power source and a radio frequency load of the plasma etching system;
 said matching network having at least one adjustable matching element for matching the load to the source;
 said at least one adjustable matching element having a correspondinR servo step positioner, wherein said corresponding positioner adjusts the position of said at least one adjustable matching element;
 a matching network controller having pulse outputs for controlling said corresponding servo step positioner;
 a circuit for detecting and storing the pulse outputs of said matching network controller, wherein a first pulse value is representative of a first position of said at least one adjustable matching element and a second pulse value is representative of a second position of said at least one adjustable matching element; and
 said detecting circuit outputting an end-point detection signal when there is a predefined difference between the first and second pulse values.

13. A system for detecting end-point during plasma etching, comprising:
 a radio frequency source;
 a plasma etching chamber having radio frequency electrodes therewith and adapted to hold a work piece to be etched;
 a radio frequency matching network connected between said radio frequency power source and said radio frequency electrodes;
 said matching network consisting of a plurality of adjustable matching elements for matching said electrodes to said source;
 each of said plurality of adjustable matching elements having a position sensor, wherein said position sensor indicates the position of the respective matching element; and
 means for detecting a change in position of said plurality of matching elements, wherein etching end-point is indicated by the change in position.

* * * * *